(12) United States Patent
Yu

(10) Patent No.: US 6,746,926 B1
(45) Date of Patent: Jun. 8, 2004

(54) MOS TRANSISTOR WITH HIGHLY LOCALIZED SUPER HALO IMPLANT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,752

(22) Filed: Apr. 27, 2001

(51) Int. Cl.[7] .................. H01L 21/336; H01L 21/425
(52) U.S. Cl. .................. 438/291; 438/300; 438/303; 438/306; 438/527
(58) Field of Search .................. 438/300, 302, 438/527, 546, 303, 773, 960

(56) References Cited

U.S. PATENT DOCUMENTS

| | | | | |
|---|---|---|---|---|
| 4,998,150 A | * | 3/1991 | Rodder et al. | 257/288 |
| 5,320,974 A | * | 6/1994 | Hori et al. | 438/302 |
| 5,595,919 A | * | 1/1997 | Pan | |
| 5,733,792 A | * | 3/1998 | Masuoka | 438/302 |
| 5,834,355 A | * | 11/1998 | Doyle | 438/305 |
| 6,190,977 B1 | * | 2/2001 | Wu | 438/300 |
| 6,248,637 B1 | * | 6/2001 | Yu | 438/300 |
| 6,489,206 B2 | * | 12/2002 | Chen et al. | 438/300 |

* cited by examiner

Primary Examiner—John F. Niebling
Assistant Examiner—Ron Pompey
(74) Attorney, Agent, or Firm—Farjami & Farjami LLP

(57) ABSTRACT

A method for improving the channel doping profile of deep-submicron field effect transistors and MOSFETs. The method involves a highly localized halo implant formed in the channel region but not in the source/drain junction. The halo implant is performed through a gap formed by removal of a temporary spacer. The MOSFET is then further completed.

10 Claims, 5 Drawing Sheets

MOS TRANSISTOR WITH HIGHLY LOCALIZED SUPER HALO IMPLANT

TECHNICAL FIELD

The present invention relates generally to field effect transistor fabrication, and more particularly to engineering of the channel under the transistor to counter short field effects in deep-submicron complementary (CMOS) field effect transistors on the same chip.

BACKGROUND OF THE INVENTION

When MOSFET gate length is scaled below 100 nanometers (nm), short channel effects become significant factors. Strong or higher implant dose super halo implants are widely used in deep submicron CMOS technology to engineer the FET channel to overcome short channel effects. Super halo implants, however, tend to degrade the source/drain junction capacitance, resulting in slower switching speed of the transistor. What is needed is a method to engineer the channel doping profile without affecting the source/drain junction region to overcome the short channel effects in deep submicron CMOS chips having gate lengths of 50 nm or less.

BRIEF SUMMARY OF THE INVENTION

The present invention is a method for improving the channel doping profile of deep-submicron field effect transistors and MOSFETs. By way of example, and not of limitation, the method involves a highly localized halo implant formed in the channel region but not in the source/drain junction. The halo implant is performed through a gap formed by removal of a temporary spacer. The MOSFET is then further completed.

The resultant device exhibits an increased operating speed over heretofore known similar devices. The instant method improves device density on the chip, enhancing the manufacturing precision and efficiency. Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the device and method generally shown in FIG. 1 through FIG. 5. It will be appreciated that the device may vary as to configuration and as to details of the components, and that the method may vary as to the specific steps and sequence, without departing from the basic concepts as disclosed herein.

The present invention method for improving the channel doping profile of deep-submicron field effect transistors and MOSFETs involves a single super halo implant in the channel/body of a MOSFET of approximately 50 nm or less. The method involves forming a gate stack having a spacer, forming source/drain regions by selective epitaxy, followed by creating a silicide on the source/drain regions and gate. The spacer is then removed and a super halo implant is performed through the space thus formed by removal of the spacer. The MOSFET is then further completed.

Figure 1:
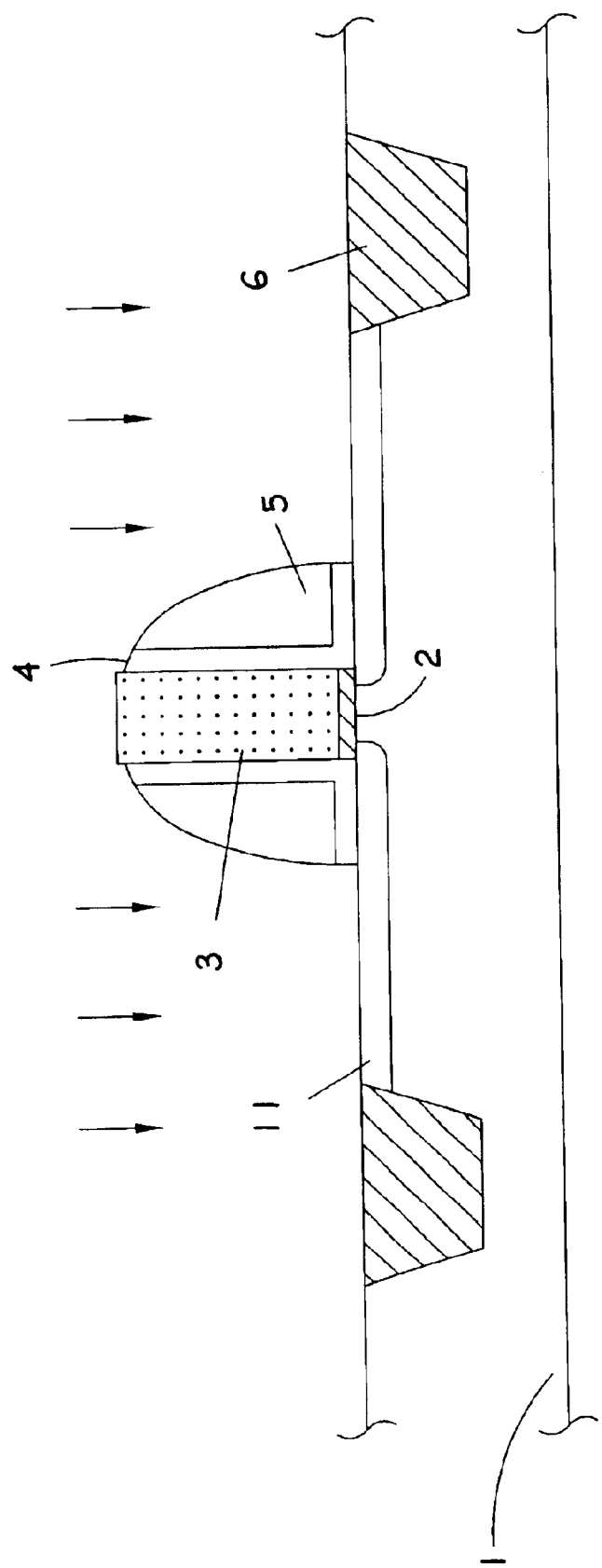
FIG. 1 is a schematic side view in cross-section of a semiconductor chip undergoing shallow source/drain extension implant.
Figure 2:
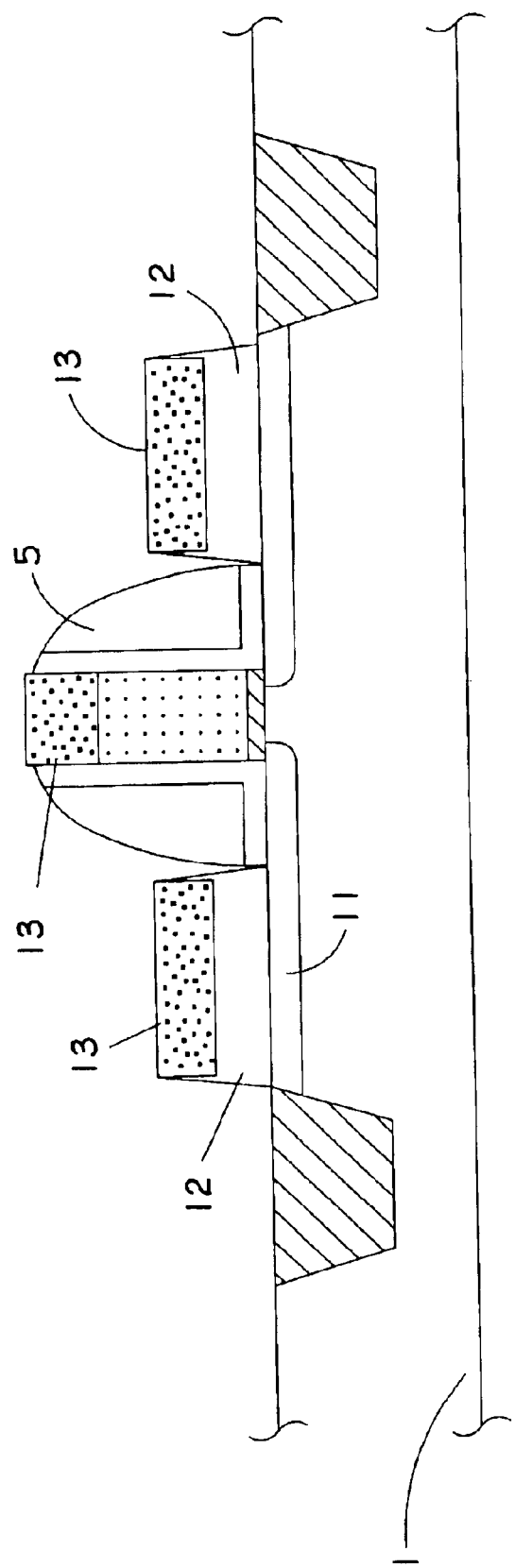
FIG. 2 is a schematic side view in cross-section of the chip of FIG. 1 undergoing epitaxy and silicidization.

Referring first to FIG. 1, a substrate 1 having gate oxide 2, gate 3, liner oxide 4 and nitride spacer 5 is prepared in the conventional manner. Isolation trenches 6 are formed, and shallow source/drain junctions 11 are implanted with ions selected from the group consisting essentially of $B^+$, $BF_2^+$, $As^+$, $Sb^+$, $P^+$, to a depth of approximately 10 nm to approximately 30 nm. Referring next to FIG. 2, a selective epitaxy is performed to form raised source/drain regions 12, followed by the formation of silicide 13 covering the source/drain regions 12 and gate 3.

Figure 3:
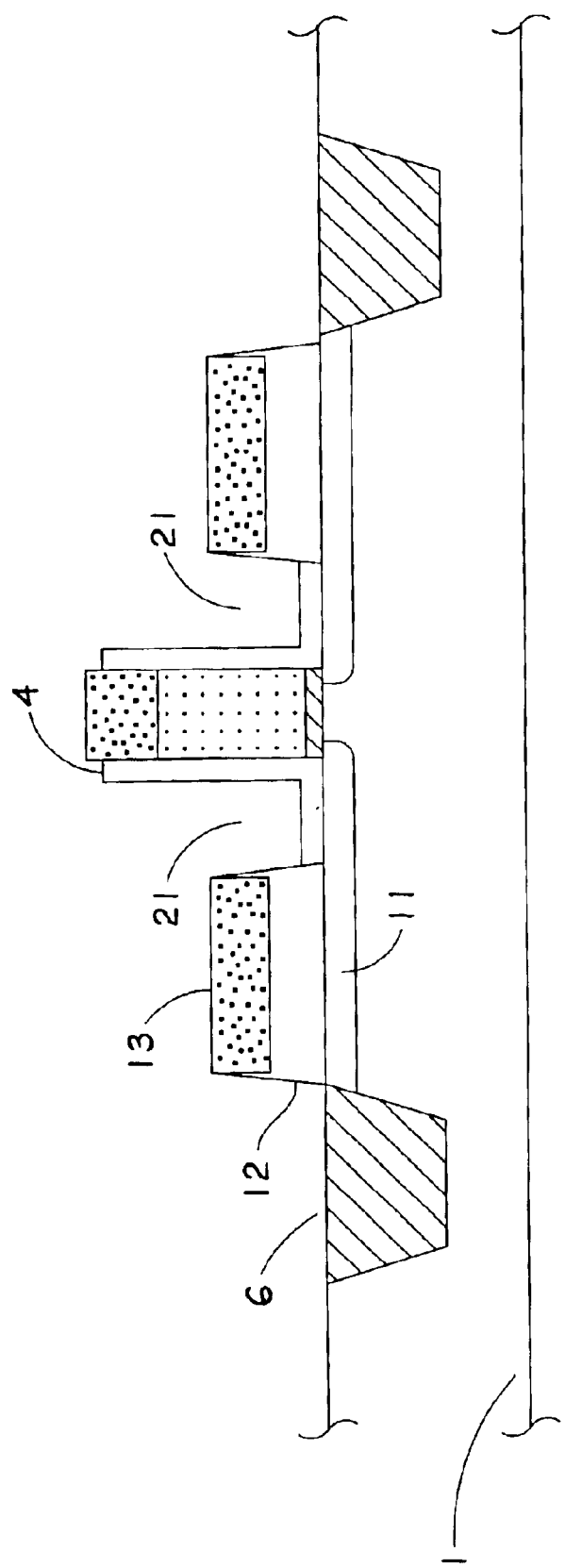
FIG. 3 is a schematic side view in cross-section of the chip of FIG. 2 after removal of the temporary spacer.
Figure 4:
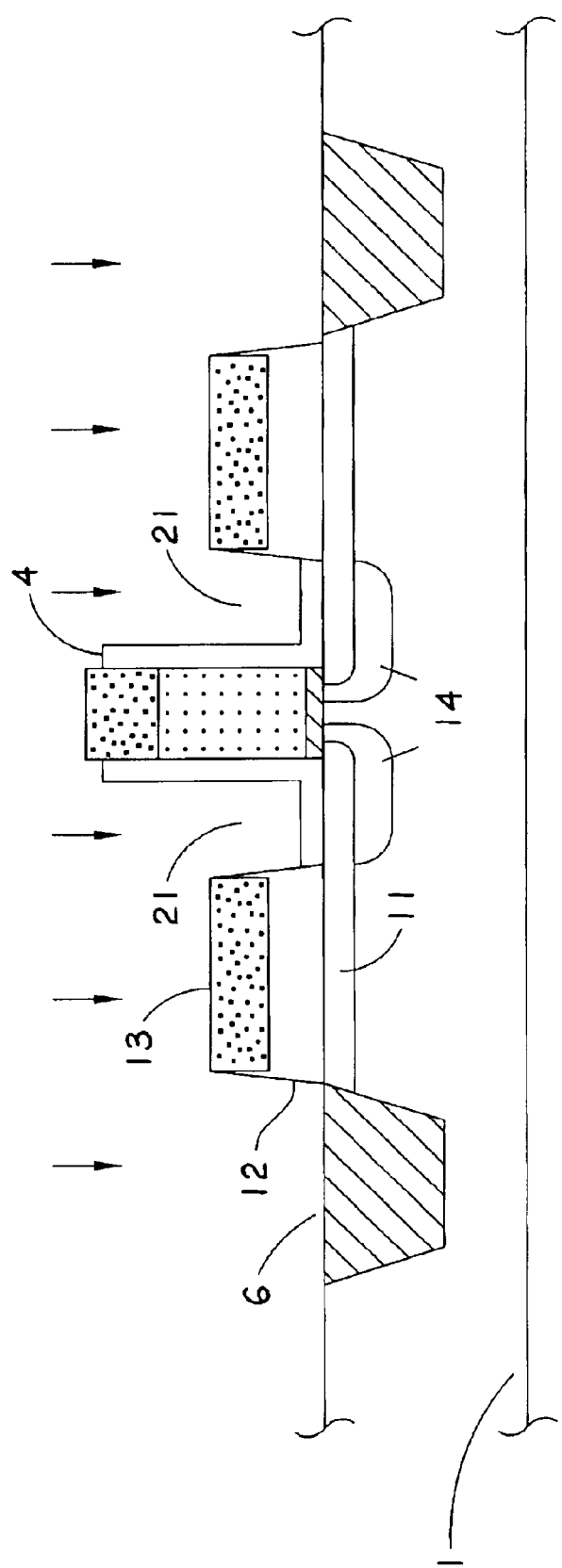
FIG. 4 is a schematic side view in cross-section of the chip of FIG. 3 undergoing a halo implant.

As shown in FIG. 3, spacer 5 is then removed by wet chemistry such as hot phosphoric acid etch, leaving liner oxide 4. Removal of spacer 5 forms a void 21 on either side of gate 3. This void 21 allows for the implantation of a localized halo. Referring now to FIG. 4, a halo implant at an essentially vertical angle to a depth of approximately 40 nm to approximately 100 nm is then performed through void 21, using gate 3, silicide 13 and source/drain regions 12 as a mask. This halo implant of ions selected from the group consisting essentially of $B^+$, $BF_2^+$, $Ga^+$, $In^+$, $As^+$, $Sb^+$, $P^+$, forms a shallow halo 14 which is localized in the channel/body region of the FET.

Figure 5:
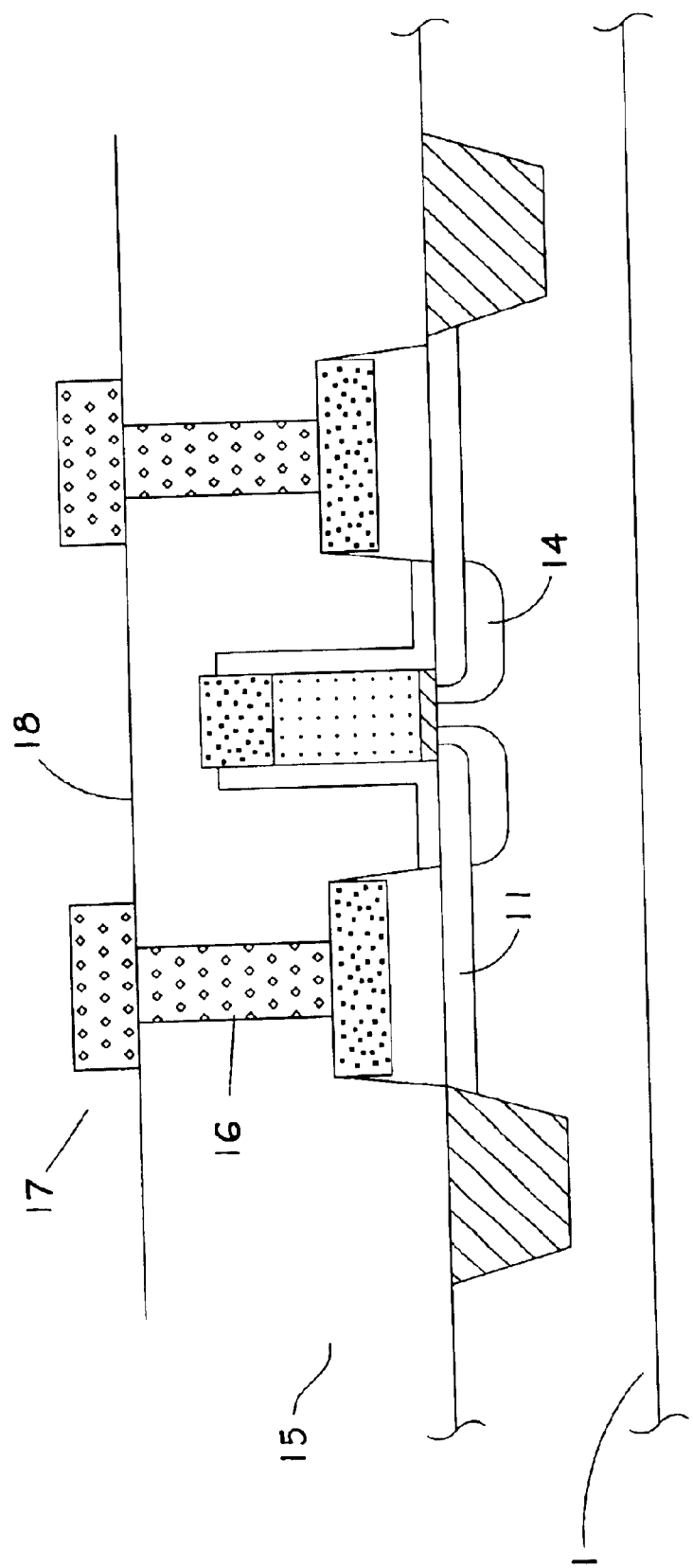
FIG. 5 is a schematic side view in cross-section of the chip of FIG. 4 undergoing subsequent MOSFET formation steps.

Then, referring to FIG. 5, oxide layer 15 is deposited on the semiconductor chip. The chip is then planarized to form surface 18, then contacts 16 and metal lines 17 are formed. The remainder of the MOSFET is then completed in the normal fashion.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of making a MOSFET, comprising:

first providing a substrate having a gate oxide and gate thereon, the gate defining a channel region of no more than 50 nm length;

second performing a source/drain extension implant;

third forming a spacer on the gate;

fourth performing epitaxy to form raised source/drain regions;

fifth forming a silicide on the gate and source/drain regions;

sixth removing the spacer, thereby forming a void region between the source/drain regions and the gate;

seventh performing a halo implant through the void, thereby forming a halo around the gate in the channel region; and eighth completing the MOSFET.

2. A method as recited in claim 1, wherein the source/drain extension implant comprises an approximately vertical implant to a depth of approximately 10 nm to 30 nm of ions selected from the group consisting essentially of $B^+$, $BF_2^+$, $As^-$, $Sb^+$, $P^+$.

3. A method as recited in claim 1, wherein the spacer comprises a nitride.

4. A method as recited in claim 1 wherein the halo implantation comprises an approximately vertical implant to a depth of approximately 40 nm to 100 nm of ions selected from the group consisting essentially of $B^+$, $BF_2^+$, $Ga^+$, $In^+$, $As^+$, $Sb^+$, $P^+$.

5. A method of making a MOSFET, comprising:

first providing a substrate having a gate oxide and gate thereon, the gate defining a channel region of no more than 50 nm length;

second performing a vertical source/drain extension implant to a depth of approximately 10 nm to approximately 30 nm;

thereafter forming a spacer on the gate;

forming raised source/drain regions;

forming a silicide on the gate and source/drain regions;

removing the spacer, thereby forming a void region through the silicide between the source/drain regions and the gate;

performing a halo implant through the void, thereby forming a halo around the gate in the channel region; and completing the MOSFET.

6. A method as recited in claim 5, wherein the spacer comprises a nitride.

7. A method as recited in claim 5, wherein the source/drain regions are formed by epitaxy.

8. A method as recited in claim 5 wherein the halo implantation comprises an approximately vertical implant to a depth of approximately 40 nm to 100 nm of ions selected from the group consisting essentially of $B^+$, $BF_2^+$, $Ga^+$, $In^+$, $As^+$, $Sb^+$, $P^+$.

9. A method of making a MOSFET, comprising:

providing a substrate having an isolation trench and a gate oxide and gate thereon, the gate defining a channel region of no more than 50 nm length;

performing an approximately vertical source/drain extension implant in a region from the isolation trench to the gate, to a depth of approximately 10 nm to approximately 30 nm;

forming a nitride spacer on the gate;

performing epitaxy to form raised source/drain regions;

forming a silicide on the gate and source/drain regions;

removing the spacer, thereby forming a void region through the silicide between the source/drain regions and the gate;

performing an approximately vertical halo implant to a depth of approximately 40 nm to approximately 100 nm, thereby forming a void region around the gate in the channel region; and completing the MOSFET.

10. A method as recited in claim 9 wherein the halo implantation comprises implantation of ions selected from the group consisting essentially of $B^+$, $BF_2^+$, $Ga^+$, $In^+$, $As^+$, $Sb^+$, $P^+$.

* * * * *